United States Patent
Tangring

(10) Patent No.: US 12,349,511 B2
(45) Date of Patent: Jul. 1, 2025

(54) RADIATION EMITTING SEMICONDUCTOR CHIP

(71) Applicant: OSRAM Opto Semiconductors GmbH, Regensburg (DE)

(72) Inventor: Ivar Tangring, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 562 days.

(21) Appl. No.: 17/762,746

(22) PCT Filed: Sep. 23, 2020

(86) PCT No.: PCT/EP2020/076529
§ 371 (c)(1),
(2) Date: Mar. 23, 2022

(87) PCT Pub. No.: WO2021/058540
PCT Pub. Date: Apr. 1, 2021

(65) Prior Publication Data
US 2022/0336700 A1    Oct. 20, 2022

(30) Foreign Application Priority Data
Sep. 26, 2019   (DE) ..................... 10 2019 126 026.4

(51) Int. Cl.
*H01L 33/14*   (2010.01)
*H10H 20/814*  (2025.01)
(Continued)

(52) U.S. Cl.
CPC ........ *H10H 20/816* (2025.01); *H10H 20/814* (2025.01); *H10H 20/857* (2025.01)

(58) Field of Classification Search
CPC ..... H01L 33/00–648; H01L 27/15–156; H01L 2933/00–0091; H10H 20/816;
(Continued)

(56) References Cited

U.S. PATENT DOCUMENTS

| | | | |
|---|---|---|---|
| 2010/0171135 A1 | 7/2010 | Engl et al. | |
| 2011/0114988 A1* | 5/2011 | Sabathil | H01L 33/642 257/E33.066 |

(Continued)

FOREIGN PATENT DOCUMENTS

| | | |
|---|---|---|
| CN | 103730555 B | 4/2014 |
| DE | 102007022947 A1 | 10/2008 |

(Continued)

OTHER PUBLICATIONS

International Search Report issued for the corresponding International Application No. PCT/EP2020/076529, dated Dec. 11, 2020, 5 pages (only for informational purposes).

(Continued)

*Primary Examiner* — Cuong B Nguyen
(74) *Attorney, Agent, or Firm* — Viering, Jentschura & Partner mbB

(57) ABSTRACT

A radiation emitting semiconductor chip may be configured to emit electromagnetic radiation from a radiation exit surface during operation. The chip may include a carrier on which a first epitaxial semiconductor layer sequence of a first conductivity type and a second epitaxial semiconductor layer sequence of a second conductivity type different from the first conductivity type are arranged, a first current spreading layer arranged between the first semiconductor layer sequence and the carrier, a second current spreading layer arranged between the first current spreading layer and the carrier, a dielectric layer arranged in regions between the first current spreading layer and the second current spreading layer, a reflective layer arranged between the second current spreading layer and the carrier, and an electrically insulating layer arranged in regions between the second current spreading layer and the reflective layer.

17 Claims, 2 Drawing Sheets

(51) Int. Cl.
*H10H 20/816* (2025.01)
*H10H 20/857* (2025.01)

(58) Field of Classification Search
CPC .. H10H 20/814; H10H 20/857; H10H 20/835; H10H 20/8162
See application file for complete search history.

(56) References Cited

U.S. PATENT DOCUMENTS

| | | | |
|---|---|---|---|
| 2013/0187192 A1 | 7/2013 | Hoeppel | |
| 2014/0061703 A1 | 3/2014 | Von Malm | |
| 2014/0070245 A1* | 3/2014 | Haberern | H01L 33/405 257/99 |
| 2014/0175489 A1 | 6/2014 | Hodota | |
| 2017/0236980 A1* | 8/2017 | Weiss | H01L 33/46 257/98 |
| 2019/0027653 A1 | 1/2019 | Eberhard | |
| 2019/0067511 A1 | 2/2019 | Totani | |
| 2019/0386174 A1 | 12/2019 | Wang et al. | |
| 2019/0386175 A1 | 12/2019 | Wang et al. | |
| 2021/0399169 A1 | 12/2021 | Tangring et al. | |
| 2022/0149241 A1* | 5/2022 | Lee | H01L 33/44 |

FOREIGN PATENT DOCUMENTS

| | | |
|---|---|---|
| DE | 102008051050 A1 | 4/2010 |
| DE | 102010025320 A1 | 12/2011 |
| DE | 102011015821 A1 | 10/2012 |
| EP | 2403025 A1 | 1/2012 |
| WO | 2017129519 A1 | 8/2017 |
| WO | 2018138081 A1 | 8/2018 |
| WO | 2018162409 A1 | 9/2018 |
| WO | 2020088877 A1 | 5/2020 |
| WO | 2020229617 A1 | 11/2020 |

OTHER PUBLICATIONS

German Search Report issued for the German Application No. 10 2019 126 026.4, dated May 8, 2020, 6 pages (only for informational purposes).

* cited by examiner

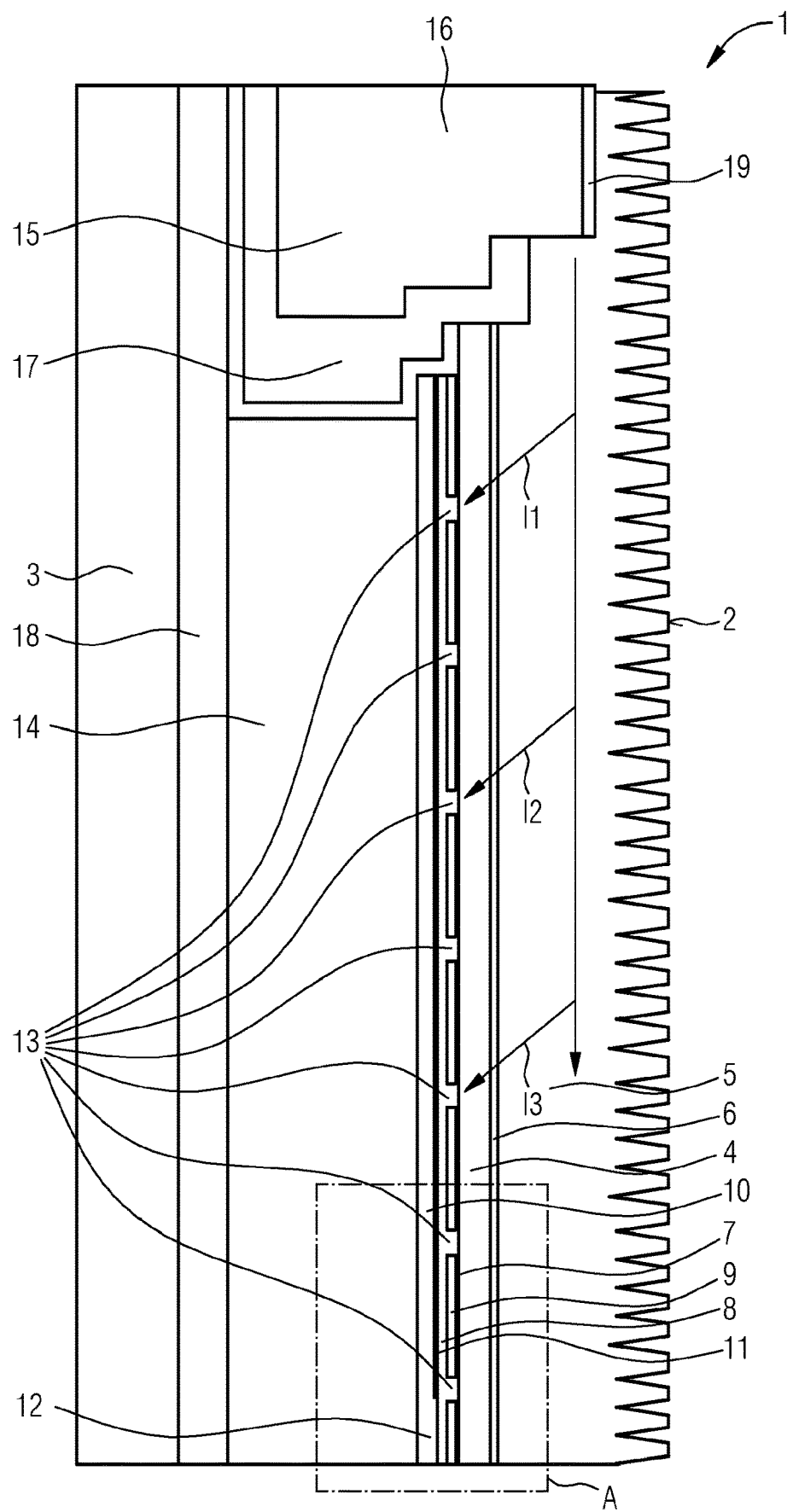

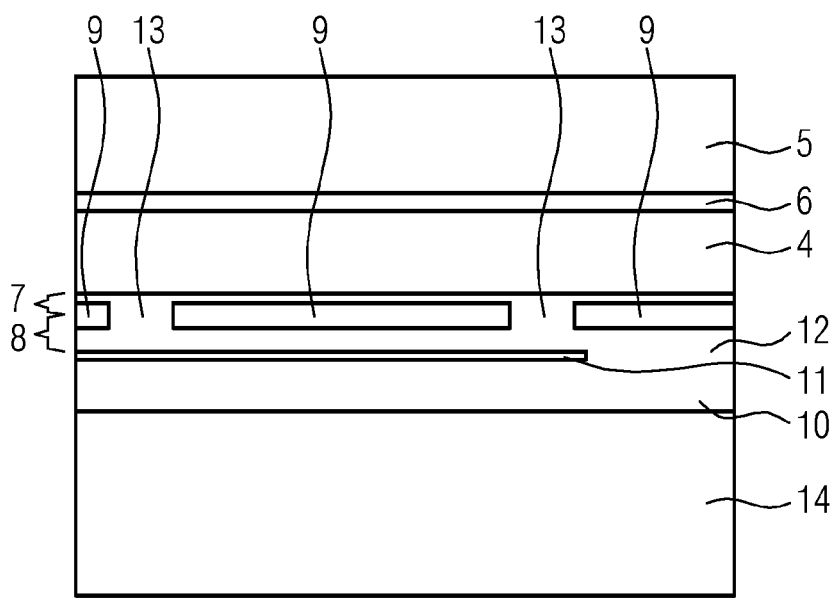
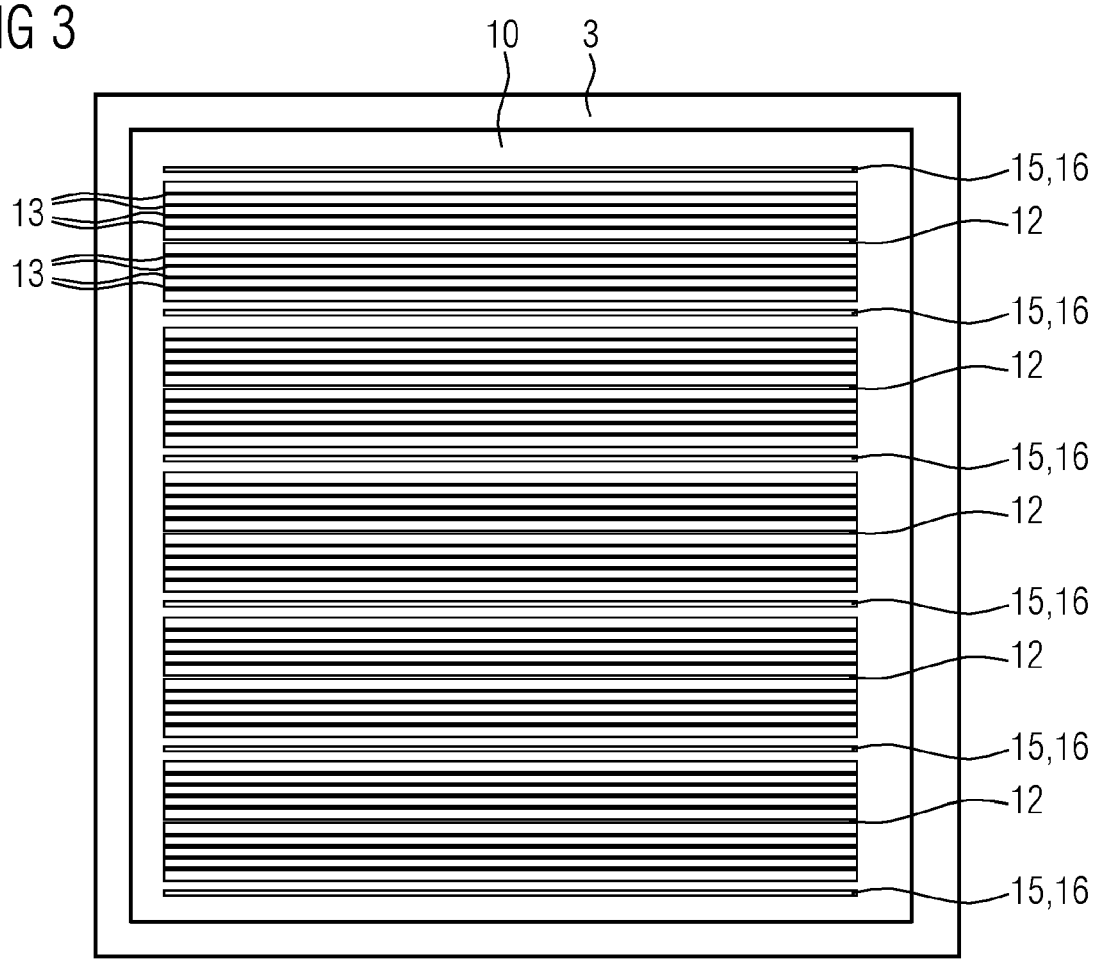

RADIATION EMITTING SEMICONDUCTOR CHIP

CROSS-REFERENCE TO RELATED APPLICATIONS

The present application is a national stage entry according to 35 U.S.C. § 371 of PCT application No.: PCT/EP2020/076529 filed on Sep. 23, 2020; which claims priority to German Patent Application Serial No.: 10 2019 126 026.4 filed on Sep. 26, 2019; all of which are incorporated herein by reference in their entirety and for all purposes.

TECHNICAL FIELD

A radiation emitting semiconductor chip is specified.

BACKGROUND

An object to be solved is to specify a radiation emitting semiconductor chip, which has a particularly homogeneous brightness. In particular, the radiation emitting semiconductor chip should have a particularly good quantum efficiency.

SUMMARY

According to at least one embodiment, the radiation emitting semiconductor chip is configured to emit electromagnetic radiation from a radiation exit surface during operation. The electromagnetic radiation emitted by the radiation emitting semiconductor chip can be near-ultraviolet radiation, visible light and/or near-infrared radiation.

The radiation emitting semiconductor chip may have a main extension plane. A vertical direction may extend perpendicular to the main extension plane and a lateral direction may extend parallel to the main extension plane.

According to at least one embodiment, the radiation emitting semiconductor chip comprises a carrier on which a first epitaxial semiconductor layer sequence of a first conductivity type and a second epitaxial semiconductor layer sequence of a second conductivity type different from the first conductivity type are arranged. In an embodiment, the first semiconductor layer sequence and the second semiconductor layer sequence are epitaxially grown on top of one another. That is to say that the first semiconductor layer sequence and the second semiconductor layer sequence are stacked on top of one another in the vertical direction. In an embodiment, the first semiconductor layer sequence is p-doped and thus p-conductive. Furthermore, the second semiconductor layer sequence may be n-doped and thus n-conductive. Thus, the first conductivity type may be a p-conductive type and the second conductivity type may be an n-conductive type.

An active region may be arranged between the first semiconductor layer sequence and the second semiconductor layer sequence. The active region is configured to generate electromagnetic radiation emitted from the radiation exit surface during operation. The active region may be directly adjacent to the first semiconductor layer sequence and to the second semiconductor layer sequence. The active region may have a pn junction for generating the electromagnetic radiation, such as a double heterostructure, a single quantum well structure or a multiple quantum well structure.

The first semiconductor layer sequence and the second semiconductor layer sequence may be based on a III-V compound semiconductor material. The compound semiconductor material can be a nitride compound semiconductor material. Nitride compound semiconductor materials are compound semiconductor materials containing nitride, which are the materials from the system $In_xAl_yGa_{1-x-y}N$ with $0 \leq x \leq 1$, $0 \leq y \leq 1$ and $x+y \leq 1$.

The first semiconductor layer sequence may be arranged on the carrier with a bottom surface of the first semiconductor layer sequence opposite to the radiation exit surface. That is to say that the carrier, the first semiconductor layer sequence and the second semiconductor layer sequence may be stacked on top of one another in the vertical direction. In this embodiment, the first semiconductor layer sequence may be closer to the carrier than the second semiconductor layer sequence.

The carrier may be a mechanically stabilizing component of the radiation emitting semiconductor chip. The carrier can be, for example, a printed circuit board (PCB) or a lead frame.

According to at least one embodiment, the radiation emitting semiconductor chip comprises a first current spreading layer arranged between the first semiconductor layer sequence and the carrier. In this embodiment, the carrier, the first current spreading layer and the first semiconductor layer sequence are stacked on top of one another in vertical direction, in particular in the order indicated. The first current spreading layer may be in direct contact with the first semiconductor layer sequence. Furthermore, the first current spreading layer may be arranged on the bottom surface of the first semiconductor layer sequence.

The first current spreading layer may cover the bottom surface of the first semiconductor layer sequence to a large extent. Here, too a large extent means in particular that the first current spreading layer covers at least 90%, such as 95%, of the bottom surface of the first semiconductor layer sequence. Furthermore, it is possible that the first current spreading layer completely covers the bottom surface of the first semiconductor layer sequence.

According to at least one embodiment, the radiation emitting semiconductor chip comprises a second current spreading layer arranged between the first current spreading layer and the carrier. In this embodiment, the carrier, the second current spreading layer, the first current spreading layer, the first semiconductor layer sequence and the second semiconductor layer sequence are arranged stacked on top of one another in the vertical direction, in particular in the order indicated.

In an embodiment, the first current spreading layer and/or the second current spreading layer are formed to be transparent to the electromagnetic radiation generated during operation of the radiation emitting semiconductor chip. In an embodiment, the first current spreading layer and/or the second current spreading layer are formed with a transparent, electrically conductive material. In an embodiment, the first current spreading layer and/or the second current spreading layer is configured to absorb at most 4%, in particular at most 2%, of the electromagnetic radiation generated by the active region. Accordingly, the first current spreading layer and/or the second current spreading layer transmits at least 96%, in particular at least 98%, of the electromagnetic radiation generated by the active region.

If the electromagnetic radiation generated by the active region is absorbed, it is usually a free charge carrier absorption. The absorption is usually proportional to a thickness of the first current spreading layer and/or the second current spreading layer.

The first current spreading layer and/or the second current spreading layer may have electrically conductive metals or transparent electrically conductive oxides (TCO) or are formed from one of these materials. For example, zinc oxide, tin oxide, cadmium oxide, titanium oxide, indium oxide or indium tin oxide (ITO) are TCOs. Typically, the TCOs are provided with a dopant. The dopant is usually configured to give the TCOs electrically conductive properties.

In an embodiment, the second current spreading layer has an extension in lateral direction substantially equal to an extension in lateral direction of the first current spreading layer. "Substantially equal" means here that the extension in lateral direction of the first current spreading layer does not differ from the extension in lateral direction of the second current spreading layer by more than 1 micrometer.

According to at least one embodiment, the radiation emitting semiconductor chip comprises a dielectric layer arranged in regions between the first current spreading layer and the second current spreading layer. The second current spreading layer, the dielectric layer and the first current spreading layer may be arranged stacked on top of one another in the vertical direction, in particular in the order indicated. In an embodiment, the dielectric layer is in direct contact with the first current spreading layer and the second current spreading layer, respectively. Furthermore, the first current spreading layer is not in direct contact with the second current spreading layer in the regions in which the dielectric layer is arranged between the first current spreading layer and the second current spreading layer.

The dielectric layer may include a dielectric material or is formed from a dielectric material. Furthermore, the dielectric layer may be electrically insulating.

The dielectric layer may have a refractive index that is smaller than a refractive index of the first current spreading layer and/or a refractive index of the second current spreading layer. The refractive index of the first current spreading layer and/or the refractive index of the second current spreading layer is, for example, between 1.5 and 2.0 inclusive, in particular between 1.7 and 2.0 inclusive. The refractive index of the dielectric layer in this case may be at least 1.38 and at most 1.80, in particular about 1.46 or about 1.50. In an embodiment, the refractive index of the dielectric layer is at least 0.2 smaller than the refractive index of the first current spreading layer and/or the second current spreading layer.

According to at least one embodiment, the radiation emitting semiconductor chip comprises a reflective layer arranged between the second current spreading layer and the carrier. The carrier, the reflective layer, the second current spreading layer, the dielectric layer, the first current spreading layer, the first semiconductor layer sequence and the second semiconductor layer sequence may be arranged stacked on top of one another in the vertical direction, in particular in the order indicated.

The reflective layer may have a reflectivity of at least 90%, in particular of at least 95%, for the electromagnetic radiation generated by the active region. In an embodiment, the reflective layer comprises a reflective metal, such as silver. In this case, the reflective layer is typically electrically conductive.

According to at least one embodiment, the radiation emitting semiconductor chip comprises an electrically insulating layer which is arranged in regions between the second current spreading layer and the reflective layer. In an embodiment, the electrically insulating layer is in direct contact with the second current spreading layer and the reflective layer.

In an embodiment, the second current spreading layer is not in direct contact with the reflective layer in the regions where the insulating layer is arranged between the second current spreading layer and the reflective layer.

In an embodiment, the reflective layer, the electrically insulating layer, the first current spreading layer, the dielectric layer, the first current spreading layer, the first semiconductor layer sequence and the second semiconductor layer sequence are arranged one above the other in the vertical direction, in particular in the order indicated.

The electrically insulating layer may include an electrically insulating material, such as a dielectric material, or is formed thereof. The material of the electrically insulating layer is, for example, silicon dioxide. The electrically insulating layer may have a thickness in vertical direction which is at most 50 nanometers, in particular at most 10 nanometers. Furthermore, it is possible that the electrically insulating layer is at most 10 monolayers, in particular at most 2 monolayers, of the material of the electrically insulating layer.

According to at least one embodiment, the reflective layer and the second current spreading layer are in electrically conductive contact.

According to an embodiment, the radiation emitting semiconductor chip is configured to emit electromagnetic radiation from a radiation exit surface during operation. In addition, the radiation emitting semiconductor chip comprises a carrier on which a first epitaxial semiconductor layer sequence of a first conductivity type and a second epitaxial semiconductor layer sequence of a second conductivity type different from the first conductivity type are arranged. Further, the radiation emitting semiconductor chip comprises a first current spreading layer arranged between the first semiconductor layer sequence and the carrier, and a second current spreading layer arranged between the first current spreading layer and the carrier. A dielectric layer is arranged in regions between the first current spreading layer and the second current spreading layer. Further, the radiation emitting semiconductor chip comprises a reflective layer arranged between the second current spreading layer and the carrier, and an electrically insulating layer arranged in regions between the second current spreading layer and the reflective layer. In addition, the reflective layer and the second current spreading layer are in electrically conductive contact.

Typically, the first semiconductor layer sequence, which is in particular p-doped, has a poorer conductivity in lateral direction than the second semiconductor layer sequence, which is in particular n-doped. Since the conductivity in lateral direction is typically inversely proportional to a sheet resistance, the first semiconductor layer sequence has a higher sheet resistance than the second semiconductor layer sequence. If the sheet resistances of the first semiconductor layer sequence and the second semiconductor layer sequence deviate from one another by more than 100%, in particular by more than 50%, a current density in the region of the active region is typically particularly inhomogeneous.

An idea of the radiation emitting semiconductor chip described here is, inter alia, that a first current spreading layer and a second current spreading layer are arranged on the first semiconductor layer sequence. Thus, a sheet resistance of a layer sequence comprising the first semiconductor layer sequence, the first current spreading layer and the second current spreading layer can be advantageously increased. The sheet resistance of the layer sequence can thus advantageously be matched to the sheet resistance of the second semiconductor layer sequence. Such a radiation emitting semiconductor chip has a particularly homogeneous current density in the region of the active region. The radiation emitting semiconductor chip thus also exhibits a particularly good quantum efficiency.

A further idea of the radiation emitting semiconductor chip described here is, inter alia, that a dielectric layer is arranged in regions between the first current spreading layer and the second current spreading layer. Since the dielectric layer may have a refractive index smaller than a refractive index of the first current spreading layer and a refractive index of the second current spreading layer, electromagnetic radiation is advantageously reflectable by the dielectric layer. Thus, electromagnetic radiation does not have to pass completely through the current spreading layers until it is reflected at the reflective layer. In this way, the current spreading layers advantageously absorb comparatively little electromagnetic radiation from the active region.

If a radiation emitting semiconductor chip does not have an electrically insulating layer, propagation paths of charge carriers in the first semiconductor layer sequence and the second semiconductor layer sequence are usually of different lengths. Thus, different series resistances act on the charge carriers imprinted in the semiconductor layer sequences.

A further idea of the radiation emitting semiconductor chip described here is, inter alia, that an electrically insulating layer is arranged in regions between the second current spreading layer and the reflective layer. This means that the reflective layer is only in direct contact with the second current spreading layer in certain areas. Advantageously, the series resistances can be aligned in this way. Thus, a particularly homogeneous current density can be achieved in such a radiation emitting semiconductor chip in the region of the active region.

According to at least one embodiment of the semiconductor chip, the electrically insulating layer covers at least 90% of the second current spreading layer. In an embodiment, the electrically insulating layer covers at least 95%, in particular at least 99%, of the second current spreading layer.

According to at least one embodiment of the semiconductor chip, the electrically insulating layer comprises at least one first recess in which the reflective layer and the second current spreading layer are in electrically conductive contact. The first recess may completely penetrate the insulating layer. In an embodiment, charge carriers can be impressed into the first semiconductor layer sequence exclusively through the first recess via the first current spreading layer and the second current spreading layer.

According to at least one embodiment of the semiconductor chip, the first recess has a width of at least 100 nanometers and at most 25 micrometers. In an embodiment, the first recess has a width of at least 1 micrometer and at most 10 micrometers, such as at least 1 micrometer and at most 5 micrometers. For example, the first recess has a width of about 5 micrometers.

According to at least one embodiment of the semiconductor chip, the dielectric layer is configured to reflect electromagnetic radiation towards the radiation exit surface. In an embodiment, the dielectric layer comprises a plurality of sub-layers. In an embodiment, the sub-layers also comprise a dielectric material. In an embodiment, the dielectric layer comprises alternately arranged sub-layers of a high refractive index material and a low refractive index material. The sublayers may have $SiO_2$, $Al_2O_3$, $TiO_2$, tantalum oxide, $Nb_2O_5$, $MgF_2$, silicon nitrides and/or silicon oxynitrides.

The dielectric mirror layer may have a reflectivity of at least 98%, in particular of at least 99%, for the electromagnetic radiation generated in the active region. According to at least one embodiment of the semiconductor chip, a thickness of the first current spreading layer is smaller than a thickness of the second current spreading layer. The thickness of the first current spreading layer may be at least 5 nanometers and at most 50 nanometers, such as at least 15 nanometers and at most 30 nanometers. The thickness of the second current spreading layer may be at least 50 nanometers and at most 1 micrometer, such as at least 100 nanometers and at most 400 nanometers, in particular about 200 nanometers. Advantageously, in an arrangement described herein, the thickness of the second current spreading layer need not be taken into account with respect to absorption losses of electromagnetic radiation in the second current spreading layer.

According to at least one embodiment of the semiconductor chip, the dielectric layer comprises second recesses. The second recesses may penetrate the dielectric layer completely.

According to at least one embodiment of the semiconductor chip, the first current spreading layer is in electrically conductive contact with the second current spreading layer in the second recesses. In an embodiment, charge carriers can be impressed into the first semiconductor layer sequence exclusively via the second recesses through the first current spreading layer.

According to at least one embodiment of the semiconductor chip, the second recesses are arranged at grid points of a grid. The grid may be a polygonal grid, such as an orthogonal grid or a hexagonal grid. The grid can be a regular grid. Alternatively, the grid can be an irregular grid.

According to at least one embodiment of the semiconductor chip, the second recesses each have a diameter of at least 100 nanometers and at most 10 micrometers. In an embodiment, the diameter corresponds to a maximum extension in lateral direction of one of the second recesses. For example, the diameters of the second recesses are each about 1 micrometer. In an embodiment, the second recesses have an area fraction of at most 5%, in particular at most 1%, of an area in lateral direction of the first current spreading layer.

According to at least one embodiment, the radiation emitting semiconductor chip comprises at least one first contact structure configured to impress current into the first semiconductor layer sequence. In particular, the first contact structure is configured to impress charge carriers into the first semiconductor layer sequence.

The first contact structure may include an electrically conductive metal or consists thereof. The metal is for example one of the following materials: copper, gold, platinum, titanium, aluminium, silver.

According to at least one embodiment, the radiation emitting semiconductor chip comprises at least one second contact structure configured to impress current into the second semiconductor layer sequence. In particular, the second contact structure is configured to impress charge carriers into the second semiconductor layer sequence. The second contact structure may be not in direct contact with the first semiconductor layer sequence at any point. Furthermore, the electrically conductive metal of the first contact structure can be the same as the electrically conductive metal of the second contact structure.

Furthermore, it is possible that the radiation emitting semiconductor chip comprises a plurality of second contact structures. The second contact structures may be arranged parallel to one another. In this case, the radiation emitting semiconductor chip also comprises a plurality of the first contact structures, each first contact structure being arranged between two second contact structures. The first contact structures may extend parallel to the second contact structures. Furthermore, the first contact structures may cover an area between two second contact structures to a large extent. "To a large extent" means here in particular that each first contact structure covers at least 90%, such as at least 95%, of the area between two second contact structures.

According to at least one embodiment of the semiconductor chip, charge carriers imprinted in the semiconductor layer sequences propagate along different propagation paths, each of which has a series resistance.

According to at least one embodiment of the semiconductor chip, each propagation path starts from the second contact structure and extends through a respective one of the second recesses towards the first recess.

According to at least one embodiment of the semiconductor chip, the series resistances of different propagation paths are substantially equal. The term "substantially equal" means here and hereinafter that the series resistances of different propagation paths do not differ by more than 5%, in particular by no more than 1%.

According to at least one embodiment of the semiconductor chip, the first contact structure is arranged between the reflective layer and the carrier. Here, the first contact structure may be in direct contact with the reflective layer.

According to at least one embodiment of the semiconductor chip, the second contact structure extends through a third recess through the first semiconductor layer sequence to the second semiconductor layer sequence. In an embodiment, the third recess partially exposes the second semiconductor layer sequence. That is to say that the third recess extends partially into the second semiconductor layer sequence in the vertical direction. In this case, a top surface of the third recess may be formed by the second semiconductor layer sequence. Side surfaces of the third recess adjacent to the top surface of the third recess may be formed by the first semiconductor layer sequence, the active region and the second semiconductor layer sequence. The side surfaces of the third recess may be perpendicular to the top surface of the third recess. Alternatively, the side surfaces of the third recess can enclose an angle with the top surface of the third recess being different from 90°.

In this embodiment, the second contact structure is arranged in the third recess. The second contact structure may be electrically conductively connected to the second semiconductor layer sequence via the top surface of the third recess. In an embodiment, the first contact structure is arranged spaced apart from the side surfaces of the third recess in lateral direction.

According to at least one embodiment of the semiconductor chip, a separation layer is arranged on at least one side surface of the first contact structure.

According to at least one embodiment of the semiconductor chip, a separation layer is arranged on at least one side surface of the second contact structure. The separation layer may include an electrically insulating material or is formed thereof. Furthermore, the separation layer can comprise at least two sub-layers. In an embodiment, the separation layer comprises $Al_2O_3$, $SiO_2$ and/or $Si_3N_4$ or is formed from one of these materials.

In an embodiment, there is no electrically conductive contact between the first contact structure and the second contact structure through the separation structure. In particular, the second contact structure is electrically isolated from the first semiconductor layer sequence by the separation structure.

According to at least one embodiment of the semiconductor chip, the first recess is arranged spaced apart from the second contact structure in lateral direction. For example, a distance in lateral direction of the first recess to the second contact structure is at least 20 micrometers, in particular at least 500 micrometers.

According to at least one embodiment of the semiconductor chip, the second contact structure and the first recess extend parallel to one another. In an embodiment, the second contact structure and the first recess each have a length. In an embodiment, the lengths each correspond to a maximum extension in the lateral direction. In an embodiment, the lengths each extend along a main extension direction. The main extension directions may be arranged parallel to one another and extend in lateral direction.

Due to such a parallel arrangement of the second contact structure and the first recess, the charge carriers to be impressed can spread particularly homogeneously in the first semiconductor layer sequence and/or the second semiconductor layer sequence. Advantageously, a particularly high homogeneity of the current density in the active region can thus be achieved.

The length of the second contact structure and the length of the first recess are substantially equal. The term "substantially equal" means here and hereinafter that the lengths do not differ from one another by more than 5 micrometers. In an embodiment, the length of the second contact structure and the length of the first recess are each at least 100 micrometers and at most 5 millimeters, such as at least 500 micrometers and at most 1 millimeter.

If the radiation emitting semiconductor chip comprises a plurality of second contact structures, a plurality of first recesses may be arranged in the electrically insulating layer. The second contact structures and the first recesses may extend parallel to one another. Furthermore, the second contact structures and the first recesses may be arranged alternately. In this case, the first recesses may be located centrally between two second contact structures.

If the radiation emitting semiconductor chip comprises a plurality of second contact structures, a plurality of second recesses may be arranged between one of the second contact structures and one of the first recesses, respectively. In this case, the second recesses may extend parallel to the first recesses and the second contact structures.

According to at least one embodiment of the semiconductor chip, the second recesses and the second contact structure extend parallel to one another. In an embodiment, the second recesses each have a length. In an embodiment, the lengths each extend along a main extension direction. The main extension directions of the second recesses may be arranged parallel to one another.

The length of the second recesses and the length of the first recess are substantially equal. The term "substantially equal" means here and hereinafter that the lengths do not differ from one another by more than 5 micrometers.

Further, the second recesses each have an extension in lateral direction, perpendicular to the main extension direction of the second recesses, of at least 100 nanometers and at most 10 micrometers. For example, the extent in lateral direction of the second recesses is about 1 micrometer in each case.

In this case, the second recesses have a distance along the main extension direction of the second recesses of at least 1 micrometer and at most 100 micrometers. In an embodiment, the second recesses have a distance between one another of at least 10 micrometers and at most 50 micrometers.

According to at least one embodiment of the semiconductor chip, the first contact structure is completely covered by the reflective layer. Furthermore, it is possible that the reflective layer protrudes in lateral direction beyond the first contact structure.

According to at least one embodiment of the semiconductor chip, the first contact structure and/or the second contact structure are/is electrically conductively arranged on the carrier. In an embodiment, an electrically conductive adhesion promoting layer is arranged between the first contact structure and/or the second contact structure and the carrier. In an embodiment, the adhesion promoting layer comprises a solderable metal or is formed from a solderable metal.

BRIEF DESCRIPTION OF THE DRAWINGS

Hereinafter, the radiation emitting semiconductor chip is explained in more detail with reference to the Figures by means of exemplary embodiments.

FIGS. 1 and 2 a schematic sectional view of a radiation emitting semiconductor chip according to an exemplary embodiment, and FIG. 3 a schematic top view of a radiation emitting semiconductor chip according to an exemplary embodiment.

Elements that are identical, similar or have the same effect are given the same reference signs in the Figures. The Figures and the proportions of the elements shown in the Figures are not to be regarded as true to scale. Rather, individual elements can be shown exaggeratedly large for better representability and/or for better comprehensibility.

DETAILED DESCRIPTION

The radiation emitting semiconductor chip 1 according to the exemplary embodiment of FIGS. 1 and 2 comprises a carrier 3 on which a first epitaxial semiconductor layer sequence 4 of a first conductivity type and a second epitaxial semiconductor layer sequence 5 of a second conductivity type different from the first conductivity type are arranged. In this exemplary embodiment, the first semiconductor layer sequence 4 is p-doped. Furthermore, the second semiconductor layer sequence is n-doped here.

An active region 6 is arranged between the first semiconductor layer sequence 4 and the second semiconductor layer sequence 5, which is configured to generate electromagnetic radiation during operation, which is emitted from a radiation exit surface 2 of the semiconductor chip 1. A top surface of the second semiconductor layer sequence 5 facing away from the carrier 3 here comprises the radiation exit surface 2. Furthermore, the top surface of the second semiconductor layer sequence 5 is structured. Advantageously, electromagnetic radiation generated in the active region 6 can thus be coupled out particularly well. A bottom surface of the first semiconductor layer sequence 4 faces the carrier 3.

A first current spreading layer 7 and a second current spreading layer 8 are arranged between the first semiconductor layer sequence 4 and the carrier 3. The first current spreading layer 7 is arranged here in direct contact with the bottom surface of the first semiconductor layer sequence 4.

The first current spreading layer 7 and the second current spreading layer 8 are formed to be transparent to the electromagnetic radiation generated during operation of the radiation emitting semiconductor chip. In this exemplary embodiment, the first current spreading layer 7 and the second current spreading layer 8 comprise ITO or are formed thereof.

Further, a thickness of the first current spreading layer 7 is smaller than a thickness of the second current spreading layer 8. The thickness of the first current spreading layer 7 in this exemplary embodiment is about 15 nanometers. The thickness of the second current spreading layer 8 is here about 90 nanometers.

A dielectric layer 9 is arranged in regions between the first current spreading layer 7 and the second current spreading layer 8. The dielectric layer 9 is in direct contact with the first current spreading layer 7 with an outer surface facing the first current spreading layer 7. Furthermore, the dielectric layer 9 is in direct contact with the second current spreading layer 8 with an outer surface facing the second current spreading layer 8. Furthermore, the dielectric layer 9 has second recesses 13. The second recesses 13 completely penetrate the dielectric layer. The first current spreading layer 7 is in direct and electrically conductive contact with the second current spreading layer 8 in the second recesses 13.

In addition, a reflective layer 10 is arranged between the second current spreading layer 8 and the carrier 3. In this exemplary embodiment, the reflective layer 10 comprises silver.

Furthermore, an electrically insulating layer 11 is arranged in regions between the second current spreading layer 8 and the reflective layer 10. The electrically insulating layer 11 is in direct contact with the reflective layer 10 and the second current spreading layer 8 and is further formed electrically insulating. The electrically insulating layer 11 has a first recess 12. The first recess 12 completely penetrates the electrically insulating layer 11. The second current spreading layer 8 is in direct and electrically conductive contact with the reflective layer 10 in the first recess 12.

Furthermore, a first contact structure 14 is arranged between the reflective layer 10 and the carrier, which is configured to impress current into the first semiconductor layer sequence 4. Spaced apart in lateral direction from the first contact structure 14, a third recess 16 extends through the first semiconductor layer sequence 4 up to the second semiconductor layer sequence 5. The third recess 16 extends vertically partially into the second semiconductor layer sequence 5 and partially exposes the second semiconductor layer sequence 5.

The third recess 16 comprises a second contact structure 15 configured to impress current into the second semiconductor layer sequence 5. In this exemplary embodiment, a contact layer is arranged between the second contact structure 15 and the second semiconductor layer sequence 5.

Furthermore, a separation layer 17 is arranged between side surfaces of the third recess 16 and the second contact structure 15. The separation layer 17 is further arranged on a bottom surface of the second contact structure 15 facing away from the second semiconductor layer sequence 5. In this exemplary embodiment, the separation layer 17 comprises two sub-layers, one of the sub-layers having $Al_2O_3$ and the other of the sub-layers having $SiO_2$.

In this exemplary embodiment, the first contact structure 14 is electrically conductively attached to the carrier 3 by an adhesion promoting layer 18.

During operation of the radiation emitting semiconductor chip 1, charge carriers are impressed into the second semiconductor layer sequence 5 by the second contact structure 15. The charge carriers then propagate along different propagation paths I1, I2, I3 in the first semiconductor layer sequence 4 and the second semiconductor layer sequence 5. Here, the propagation paths each have a series resistance.

In the case that the radiation emitting semiconductor chip 1 does not have an electrically insulating layer 11, each propagation path I1, I2, I3 starts from the second contact structure and extends through a respective one of the second recesses to the reflective layer 12. The propagation paths I1, I2, I3 and the corresponding series resistances are thus all different from one another. In this case, the series resistance of propagation path I1 through the nearest second recess 13 would be the lowest. The propagation path I3 through a second recess 13 further away from the second contact structure 15 would be comparatively high in this case.

However, in this exemplary embodiment, the radiation emitting semiconductor chip 1 has the electrically insulating layer 11, so that the propagation paths I1, I2, I3 extend from the second contact structure 15 through each of the second recesses 13 towards the first recess 12 of the insulating layer 11.

Thus, the series resistances of different propagation paths I1, I2, I3 are substantially equal. Such a radiation emitting semiconductor chip 1 thus has a particularly homogeneous current density in the active region 6.

The radiation emitting semiconductor chip 1 according to the exemplary embodiment of FIG. 3 comprises several of the third recesses 16, in each of which a second contact structure 15 is arranged. Furthermore, the radiation emitting semiconductor chip 1 comprises a plurality of the first recesses 12.

The second contact structures 15 and the first recesses 12 extend parallel to one another. Further, the second contact structures 15 and the first recesses 12 are arranged alternately. In this exemplary embodiment, the first recesses 12 are each located centrally between two second contact structures 15.

Furthermore, the second recesses 13 and the second contact structure 15 extend parallel to one another. Here, several of the second recesses 13 are arranged between one of the second contact structures 15 and one of the first recesses 12, respectively.

The priority of German patent application DE 102019126026.4 is claimed, the disclosure content of which is hereby expressly incorporated by reference.

The features and exemplary embodiments described in connection with the Figures can be combined in accordance with further exemplary embodiments, although not all combinations are explicitly described. Furthermore, the exemplary embodiments described in connection with the Figures can alternatively or additionally have further features according to the description in the general part.

The invention is not limited by the description on the basis of the exemplary embodiments. Rather, the invention encompasses any new feature as well as any combination of features, which in particular includes any combination of features in the claims, even if this feature or combination itself is not explicitly indicated in the claims or exemplary embodiments.

REFERENCES 1 radiation emitting semiconductor chip
2 radiation exit surface
3 carrier
4 first semiconductor layer sequence
5 second semiconductor layer sequence
6 active region
7 first current spreading layer
8 second current spreading layer
9 dielectric layer
10 reflective layer
11 insulating layer
12 first recess
13 second recess
14 first contact structure
15 second contact structure
16 third recess
17 separation layer
18 adhesion promoting layer
19 contact layer
A Cut-out
I1, I2, I3 propagation path

The invention claimed is:

1. A radiation emitting semiconductor chip configured to emit electromagnetic radiation from a radiation exit surface, wherein the radiation emitting semiconductor chip comprises:
 a carrier comprising a first epitaxial semiconductor layer sequence of a first conductivity type and a second epitaxial semiconductor layer sequence of a second conductivity type different from the first conductivity type arranged thereon;
 a first current spreading layer arranged between the first semiconductor layer sequence and the carrier;
 a second current spreading layer arranged between the first current spreading layer and the carrier;
 a dielectric layer arranged in regions between the first current spreading layer and the second current spreading layer;
 a reflective layer arranged between the second current spreading layer and the carrier; and
 an electrically insulating layer arranged in regions between the second current spreading layer and the reflective layer;
 wherein the reflective layer and the second current spreading layer are in electrically conductive contact;
 wherein the first current spreading layer and the second current spreading layer are formed with a transparent, electrically conductive material;
 wherein the first current spreading layer and the second current spreading layer are regionally in direct contact.

2. The radiation emitting semiconductor chip according to claim 1, wherein the electrically insulating layer covers at least 90% of the second current spreading layer.

3. The radiation emitting semiconductor chip according to claim 2, wherein the electrically insulating layer has at least a first separation portion, in which the reflective layer and the second current spreading layer are in electrically conductive contact.

4. The radiation emitting semiconductor chip according to claim 3, wherein the first separation portion has a width ranging from 500 nanometers to 50 micrometers.

5. The radiation emitting semiconductor chip according to claim 1, wherein a thickness of the first current spreading layer is smaller than a thickness of the second current spreading layer.

6. The radiation emitting semiconductor chip according to claim 1, wherein the dielectric layer is configured to reflect electromagnetic radiation towards the radiation exit surface.

7. The radiation emitting semiconductor chip according to claim 1 wherein:
 the dielectric layer comprises second separation portions; and
 the first current spreading layer is in electrically conductive contact with the second current spreading layer in the second separation portions.

8. The radiation emitting semiconductor chip according to claim 7, wherein:
 the second separation portions are arranged at grid points of a grid; and the second separation portions each have a diameter ranging from 100 nanometers to 10 micrometers.

9. The radiation emitting semiconductor chip according to claim 1, further comprising:
   at least one first contact structure configured to impress current into the first semiconductor layer sequence; and
   at least one second contact structure configured to impress current into the second semiconductor layer sequence.

10. The radiation emitting semiconductor chip according to claim 9, wherein:
    the first contact structure is arranged between the reflective layer and the carrier; and
    the second contact structure extends through a third recess through the first semiconductor layer sequence to the second semiconductor layer sequence.

11. The radiation emitting semiconductor chip according to claim 9, wherein:
    a separation layer is arranged on at least one side surface of the first contact structure; or
    a separation layer is arranged on at least one side surface of the second contact structure.

12. The radiation emitting semiconductor chip according to claim 9, wherein the first separation portion is arranged spaced apart from the second contact structure in a lateral direction.

13. The radiation emitting semiconductor chip according to claim 12, wherein the second contact structure and the first separation portion extend parallel to one another.

14. The radiation emitting semiconductor chip according to claim 12, wherein:
    charge carriers impressed in the semiconductor layer sequences propagate along different propagation paths, each of which has a series resistance;
    the dielectric layer comprises second separation portions, and each propagation path starts from the second contact structure and extends through a respective one of the second separation portions, to the first separation portion; and
    the series resistances of different propagation paths are substantially equal.

15. The radiation emitting semiconductor chip according to claim 9, wherein the first contact structure is completely covered by the reflective layer.

16. The radiation emitting semiconductor chip according to claim 9, wherein the dielectric layer comprises second separation portions, and the second separation portions and the second contact structure extend parallel to one another.

17. The radiation emitting semiconductor chip according to claim 9, wherein the first contact structure and/or the second contact structure are/is electrically conductively arranged on the carrier.

* * * * *